United States Patent
Bouisse et al.

(10) Patent No.: US 11,722,101 B2
(45) Date of Patent: Aug. 8, 2023

(54) 90-DEGREE LUMPED AND DISTRIBUTED DOHERTY IMPEDANCE INVERTER

(71) Applicant: MACOM Technology Solutions Holdings, Inc., Lowell, MA (US)

(72) Inventors: Gerard Bouisse, Toulouse (FR); Andrew Alexander, Belfast (GB); Andrew Patterson, Lisburn (GB)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 17/554,617

(22) Filed: Dec. 17, 2021

(65) Prior Publication Data

US 2022/0109406 A1    Apr. 7, 2022

Related U.S. Application Data

(63) Continuation of application No. 16/530,293, filed on Aug. 2, 2019, now Pat. No. 11,233,483, which is a
(Continued)

(51) Int. Cl.
*H03F 3/68* (2006.01)
*H03F 1/02* (2006.01)
(Continued)

(52) U.S. Cl.
CPC .......... *H03F 1/0288* (2013.01); *H01L 23/66* (2013.01); *H03F 1/565* (2013.01); *H03F 3/195* (2013.01);
(Continued)

(58) Field of Classification Search
CPC ........ H03F 1/0288; H03F 1/565; H03F 3/195; H03F 3/245; H03F 2200/451;
(Continued)

(56) References Cited

U.S. PATENT DOCUMENTS

| 4,375,054 A | 2/1983 | Pavio et al. |
| 6,085,074 A | 7/2000 | Cygan |

(Continued)

FOREIGN PATENT DOCUMENTS

| CN | 101494439 A | 7/2009 |
| CN | 102137518 A | 7/2011 |

(Continued)

OTHER PUBLICATIONS

International Search Report and Written Opinion for Application No. PCT/IB2017/000727 dated Oct. 19, 2017.
(Continued)

*Primary Examiner* — Khanh V Nguyen
(74) *Attorney, Agent, or Firm* — Perilla Knox & Hildebrandt LLP; Jason M. Perilla

(57) ABSTRACT

Apparatus and methods for a modified Doherty amplifier operating at gigahertz frequencies are described. The combining of signals from a main amplifier and a peaking amplifier occur prior to impedance matching of the amplifier's output to a load. An output impedance-matching element can be relied upon. In one example, the output impedance-matching element can include an output strip line, a shunt capacitor connected between the output strip line and ground, an output capacitor connected between the output strip line and an output bonding pad, and an inductive strip line connected between the output bonding pad and ground.

19 Claims, 6 Drawing Sheets

Related U.S. Application Data continuation-in-part of application No. PCT/IB2017/000727, filed on Feb. 2, 2017, which is a continuation-in-part of application No. PCT/IB2017/000717, filed on Feb. 2, 2017, which is a continuation-in-part of application No. PCT/IB2017/000722, filed on Feb. 2, 2017.

(51) Int. Cl.
   *H03F 1/56* (2006.01)
   *H03F 3/195* (2006.01)
   *H01L 23/66* (2006.01)
   *H03F 3/24* (2006.01)

(52) U.S. Cl.
   CPC ...... *H03F 3/245* (2013.01); *H01L 2223/6611* (2013.01); *H01L 2223/6655* (2013.01); *H03F 2200/451* (2013.01)

(58) Field of Classification Search
   CPC . H03F 3/602; H03F 3/211; H03F 3/68; H03F 3/60; H03F 3/607; H01L 23/66; H01L 2223/6611; H01L 2223/6655
   USPC ............................ 330/124 R, 286, 295, 302
   See application file for complete search history.

(56) References Cited

U.S. PATENT DOCUMENTS

| | | | |
|---|---|---|---|
| 6,262,629 B1 | 7/2001 | Stengel et al. | |
| 6,649,287 B2 | 11/2003 | Weeks et al. | |
| 6,791,417 B2 | 9/2004 | Pengelly et al. | |
| 7,078,976 B2 | 7/2006 | Blednov | |
| 7,109,790 B2 | 9/2006 | Kwon et al. | |
| 7,218,175 B1 | 5/2007 | Kobayashi | |
| 7,414,478 B2 * | 8/2008 | Elmala ................. H03F 1/0288 330/295 | |
| 7,541,866 B2 | 6/2009 | Bowles et al. | |
| 7,602,241 B2 | 10/2009 | Suzuki et al. | |
| 7,663,434 B2 | 2/2010 | Yang et al. | |
| 7,876,159 B2 * | 1/2011 | Wang ........................ H03F 1/56 330/124 R | |
| 7,973,600 B2 * | 7/2011 | Yu ........................... H03F 3/602 330/124 R | |
| 8,237,498 B2 | 8/2012 | Kato et al. | |
| 8,358,174 B2 | 1/2013 | Kim et al. | |
| 8,395,450 B2 | 3/2013 | Deguchi et al. | |
| 8,466,746 B2 | 6/2013 | Jeong et al. | |
| 8,487,703 B2 | 7/2013 | Blednov | |
| 9,071,211 B1 | 6/2015 | Ozard | |
| 9,083,284 B2 | 7/2015 | Maslennikov et al. | |
| 9,331,638 B2 | 5/2016 | Chen et al. | |
| 9,531,329 B2 | 12/2016 | Tanimoto | |
| 9,543,914 B2 | 1/2017 | Bouny | |
| 9,621,115 B1 | 4/2017 | Wu | |
| 9,673,766 B1 * | 6/2017 | Roberts ................... H03F 1/565 | |
| 9,774,301 B1 | 9/2017 | Maalouf et al. | |
| 9,813,036 B2 | 11/2017 | Folkmann et al. | |
| 9,966,903 B1 | 5/2018 | McLaren et al. | |
| 10,211,785 B2 | 2/2019 | McLaren | |
| 10,284,146 B2 | 5/2019 | Wu et al. | |
| 10,284,147 B2 * | 5/2019 | Wu ........................ H03F 1/0288 | |
| 10,305,437 B2 | 5/2019 | Ozard et al. | |
| 11,018,629 B2 | 5/2021 | Min et al. | |
| 11,050,389 B2 | 6/2021 | Cassou et al. | |
| 11,159,125 B2 | 10/2021 | Bouisse et al. | |
| 11,190,143 B2 | 11/2021 | Pham et al. | |
| 11,233,483 B2 | 1/2022 | Bouisse et al. | |
| 11,245,363 B2 | 2/2022 | Bouisse | |
| 11,283,410 B2 | 3/2022 | Bouisse | |
| 11,496,098 B2 | 11/2022 | Wang | |
| 11,515,842 B2 | 11/2022 | Wang et al. | |
| 11,522,499 B2 | 12/2022 | Hue et al. | |
| 2003/0137346 A1 | 7/2003 | Hellberg | |
| 2003/0141933 A1 | 7/2003 | Pengelly | |
| 2005/0206462 A1 | 9/2005 | McCorquodale et al. | |
| 2006/0097783 A1 | 5/2006 | Okubo et al. | |
| 2007/0205827 A1 | 9/2007 | Mobbs | |
| 2010/0315162 A1 | 12/2010 | Gajadharsing et al. | |
| 2011/0140775 A1 | 6/2011 | Hong et al. | |
| 2011/0193624 A1 | 8/2011 | Scott et al. | |
| 2011/0204980 A1 | 8/2011 | Blednov | |
| 2012/0025915 A1 | 2/2012 | Ui | |
| 2012/0092074 A1 | 4/2012 | Yanduru et al. | |
| 2012/0105147 A1 | 5/2012 | Harris et al. | |
| 2012/0319780 A1 | 12/2012 | Wilson et al. | |
| 2013/0093534 A1 | 4/2013 | Mei | |
| 2013/0154729 A1 | 6/2013 | Folkmann et al. | |
| 2014/0118070 A1 | 5/2014 | Wilson et al. | |
| 2014/0132343 A1 | 5/2014 | Colantonio et al. | |
| 2014/0146917 A1 | 5/2014 | Muhammad | |
| 2014/0218116 A1 | 8/2014 | Cui et al. | |
| 2015/0002227 A1 | 1/2015 | Pribble et al. | |
| 2015/0002230 A1 | 1/2015 | Qureshi | |
| 2015/0091651 A1 | 4/2015 | Seneviratne et al. | |
| 2015/0155838 A1 | 6/2015 | Embar et al. | |
| 2015/0180428 A1 | 6/2015 | Pham et al. | |
| 2016/0036398 A1 | 2/2016 | Li | |
| 2016/0268976 A1 | 9/2016 | Negra et al. | |
| 2016/0336903 A1 | 11/2016 | Ahmed et al. | |
| 2017/0016322 A1 | 1/2017 | Hagenbuch | |
| 2017/0019071 A1 | 1/2017 | Kobayashi et al. | |
| 2017/0070193 A1 | 3/2017 | Juang et al. | |
| 2017/0085228 A1 | 3/2017 | Adbo et al. | |
| 2017/0163221 A1 | 6/2017 | Takagi et al. | |
| 2018/0026583 A1 | 1/2018 | Yanduru et al. | |
| 2018/0034418 A1 | 2/2018 | Blednov | |
| 2018/0034419 A1 | 2/2018 | Moronval | |
| 2018/0183388 A1 | 6/2018 | Pham | |
| 2018/0191309 A1 | 7/2018 | McLaren | |
| 2018/0233578 A1 | 8/2018 | Shi et al. | |
| 2018/0254748 A1 | 9/2018 | Grebennikov et al. | |
| 2019/0036487 A1 | 1/2019 | Jiang | |
| 2019/0356277 A1 | 11/2019 | Bouisse et al. | |
| 2020/0212847 A1 | 7/2020 | Pham et al. | |
| 2021/0013572 A1 | 1/2021 | Zhu | |

FOREIGN PATENT DOCUMENTS

| | | |
|---|---|---|
| CN | 102545788 A | 7/2012 |
| CN | 102577104 A | 7/2012 |
| CN | 103415993 A | 11/2013 |
| CN | 103457541 A | 12/2013 |
| CN | 102549915 A | 4/2015 |
| CN | 104660176 A | 5/2015 |
| CN | 104704747 A | 6/2015 |
| CN | 105322893 A | 2/2016 |
| CN | 105637759 A | 6/2016 |
| CN | 106357222 A | 1/2017 |
| CN | 110785928 A | 2/2020 |
| CN | 107210713 B | 3/2022 |
| EP | 2442444 A1 | 4/2012 |
| EP | 2458730 A1 | 5/2012 |
| EP | 2698918 A1 | 2/2014 |
| EP | 2806557 A1 | 11/2014 |
| EP | 2876810 A1 | 5/2015 |
| EP | 3121960 A1 | 1/2017 |
| EP | 3133735 A1 | 2/2017 |
| EP | 3179628 A2 | 6/2017 |
| EP | 3179638 A1 | 6/2017 |
| EP | 3054589 B1 | 7/2018 |
| JP | 2012222624 A | 11/2012 |
| TW | I336996 B | 2/2011 |
| TW | I377783 B | 11/2012 |
| TW | I462469 B | 11/2014 |
| TW | 201611514 A | 3/2016 |
| WO | 2009027916 A2 | 3/2009 |
| WO | 2015176077 A2 | 11/2015 |
| WO | 2017192075 A1 | 11/2017 |
| WO | 2018142176 A1 | 8/2018 |
| WO | 2018142177 A1 | 8/2018 |
| WO | 2018142178 A1 | 8/2018 |
| WO | 2018197917 A1 | 11/2018 |

(56) References Cited

FOREIGN PATENT DOCUMENTS

| WO | 2018197918 A1 | 11/2018 |
|---|---|---|
| WO | 2018197919 A1 | 11/2018 |
| WO | 2019036499 A1 | 2/2019 |
| WO | 2019069115 A1 | 4/2019 |
| WO | 2020072898 A1 | 4/2020 |
| WO | 2021137951 A1 | 7/2021 |

OTHER PUBLICATIONS

International Search Report and Written Opinion for Application No. PCT/IB2017/000608 dated Sep. 8, 2017.
International Preliminary Report on Patentability for International Application No. PCT/IB2017/000608, dated Oct. 29, 2019.
International Search Report and Written Opinion for Application No. PCT/IB2017/000717 dated Dec. 6, 2017.
International Preliminary Report on Patentability for International Application No. PCT/IB2017/000717, dated Aug. 6, 2019.
International Search Report and Written Opinion for Application No. PCT/IB2017/000722 dated Nov. 7, 2017.
International Preliminary Report on Patentability for International Application No. PCT/IB2017/000722, dated Aug. 3, 2019.
International Search Report and Written Opinion for Application No. PCT/US2017/068164 dated Mar. 13, 2018.
International Preliminary Report on Patentability for International Application No. PCT/US2017/068164 dated Apr. 3, 2019.
Office Action from European Application No. 17732555.2 dated Aug. 11, 2021.
International Search Report and Written Opinion for Application No. PCT/IB2018/046754 dated Nov. 22, 2018.
International Search Report and Written Opinion for Application No. PCT/IB2017/001575 dated Jun. 18, 2018.
International Search Report and Written Opinion for Application No. PCT/IB2017/000639 dated Sep. 8, 2017.
International Preliminary Report on Patentability for International Application No. PCT/IB2017/000639, dated Oct. 29, 2019.
International Search Report and Written Opinion for Application No. PCT/IB2017/000604 dated Sep. 8, 2017.
International Preliminary Report on Patentability for International Application No. PCT/IB2017/000604 dated Oct. 29, 2019.
International Search Report and Written Opinion for International Application No. PCT/US2019/054686, dated Dec. 19, 2019.
Camarchia et al., 7 GHz MMIC GaN Doherty Power Amplifier With 47% Efficiency at 7 dB Output Back-Off. IEEE Microwave and Wireless Components Letters Jan. 2013; 23(1):34-6.
Campbell, A Fully Integrated Ku-Band Doherty Amplifier MMIC. IEEE Microwave and Guided Wave Letters. Mar. 1999; 9(3):114-6.
Cidronali et al., Frequency Analysis and Multiline Implementation of Compensated Impedance Inverter for Wideband Doherty High-Power Amplifier Design. IEEE Transactions on Microwave Theory and Techniques. May 2016;64(5):1359-72.
Grebennikov et al., High-Efficiency Doherty Power Amplifiers: Historical Aspect and Modern Trends. Proceedings of the IEEE. Dec. 2012; 100(12):3190-219.
Kim et al., Doherty Linear Power Amplifiers for Mobile Handset Applications. Proceedings of Asia-Pacific Microwave Conference. Dec. 2006;1885-94.
Merrick et al., A wideband sequential power amplifier. 2014 IEEE MTT-S International Microwave Symposium (IMS2014). Jun. 1, 2014:1-3.
Moronval et al., A 100 W Multi-Band Four-Way Integrated Doherty Amplifier. IEEE MTT-S International Microwave Symposium (IMS) May 22, 2016:1-3.
Quaglia et al., K-Band GaAs MMIC Doherty Power Amplifier for Microwave Radio With Optimized Driver. IEEE Transactions on Microwave Theory and Techniques. Nov. 2014;62(11):2518-25.
Roberts, Understanding the 3 Level Doherty. 11th European Microwave Integrated Circuits Conference (EUMIC), European Microwave Association. Oct. 3, 2016:428-32.
Wicks et al., A 60-GHz Fully-Integrated Doherty Power Amplifier Based on 0.13-µm CMOS Process. Radio Frequency Integrated Circuits Symposium. Jun. 2008 I 7;69-72.
Yu et al., Fully Integrated Doherty Power Amplifiers for 5 GHz Wireless-LANs. IEEE Radio Frequency Integrated Circuits Symposium (RFIC). Jun. 11, 2006;153-6.
Zhou et al., Design of an S-Band Two-Way Inverted Asymmetrical Doherty Power Amplifier for Long Term Evolution Applications. Progress in Electromagnetics Research Letters. Apr. 2013;39:73-80.
Andrei Grebennikov, "A high-efficiency 100-W four-stage Doherty GaN H EMT power amplifier module for WCDMA systems", 2011 IEEE MTT-S International Microwave Symposium (Year: 2011).
Non-Final Office Action for U.S. Appl. No. 16/530,293 dated Oct. 28, 2020.
International Preliminary Report on Patentability for International Application No. PCT/IB2018/046754 dated Feb. 27, 2020.
Final Office Action for U.S. Appl. No. 16/530,293 dated Apr. 27, 2021.
International Preliminary Report on Patentability for International Application No. PCT/IB2017/000727, dated Aug. 15, 2019.
Office Action from European Application No. 17734137.7 dated Aug. 9, 2021.
Barthwal Ayushi et al, "A Design Strategy for Bandwidth Enhancement in Three-Stage Doherty Power Amplifier With Extended Dynamic Range", IEEE Transactions on Microwave Theory and Techniques, Plenum, USA, vol. 66, No. 2, ISSN 0018-9480, Feb. 2018.
Ceylan et al, "Refine Biasing Networks for High PA Low Frequency Stability," Microwave & RF, Apr. 17, 2018, pp. 1-6.
Daehyun Kang et al., "30.3% PAE HBT Doherty power amplifier for 2.5-2.7 GHz mobile WiMAX," Microwave Symposium Digest (MTT), 2010 IEEE MTT-S International, IEEE, Piscataway, NJ, USA, Piscataway, NJ, USA, (May 23, 2010), ISBN 978-1-1244-6056-1, pp. 796-799.
Daekyu Yu et al, "Fully Integrated Doherty Power Amplifiers for 5 GHz Wireless-LANs", Radio Frequency Integrated Circuits (RFIC) Symposium, 2006 IEEE, IEEE, Piscataway, NJ, USA, (Jun. 11, 2006), doi:10.1109/RFIC.2006.1651114, ISBN 978-0-7803-9572-5, pp. 153-156.
Daniel Popp et al, "High Power and High Bandwidth Digital Three-Way Doherty Power Amplifier", 2019 IEEE 20th Wireless and Microwave Technology Conference (WAMICON), IEEE, (Apr. 8, 2019), doi:10.1109/WAMICON.2019.8765455, pp. 1-6, XP033577671.
International Search Report and Written Opinion in Application No. PCT/US2020/060158, dated Mar. 10, 2021.
Office Action for European Application No. 17825920.6 dated Dec. 1, 2021.
Office Action for Taiwanese Application No. 107113817 dated Oct. 6, 2021, with Translation.
Office Action from European Application No. 17726354.8 dated May 27, 2021.
Office Action from European Application No. 17728258.9 dated May 27, 2021.
Office Action in CN Application No. 201780092425.1, dated Jan. 10, 2023, With Summary.
Office Action in CN Patent Application No. 2017800924285, dated Dec. 23, 2022, with Translation.
Office Action in EP 17726356.3, dated May 20, 2021.
Office Action in EP 18759225.8, dated Oct. 27, 2021.
Office Action in TW Application No. 107103816, with Search Report, dated Feb. 25, 2021, with Translation.
Office Action in TW Application No. 107103822, with Search Report, dated Feb. 24, 2021, with Translation.
Office Action in TW Patent Application No. 107113817 dated Jan. 21, 2021, with Translation.
Search Report for Taiwanese Application No. 107113802 dated May 26, 2021.
Translation of Office Action in TW Patent Application No. 107103832, with Search Report dated Feb. 25, 2021.

(56) References Cited

OTHER PUBLICATIONS

Vigneau et al., "Fully integrated three-way LDMOS Doherty PAs for 1.8-2.2 GHz dual-band and 2.6 GHz m-MIMO 5G applications," Published in International Journal of Microwave and Wireless Technologies, Mar. 1, 2021.

Xia Jing et al, "Improved Three-Stage Doherty Amplifier Design With Impedance Compensation in Load Combiner for Broadband Applications", IEEE Transactions on Microwave Theory and Techniques, Plenum, USA, vol. 67, No. 2, doi:10.1109/TMTT.2018.2884404, ISSN 0018-9480, (Feb. 1, 2019), pp. 778-786.

Office Action from European Application No. 17734137.7 dated Feb. 24, 2023.

Office Action from European Application No. 17732555.2 dated Feb. 2, 2023.

Cheng et al, "GaN HEMT Based Doherty Broadband Power Amplifier," Journal of Hangzhou Dianzi University (Natural Sciences), Mar. 15, 2017.

\* cited by examiner

90-DEGREE LUMPED AND DISTRIBUTED DOHERTY IMPEDANCE INVERTER

CROSS REFERENCE TO RELATED APPLICATIONS

This application is a continuation of U.S. Non-Provisional patent application Ser. No. 16/530,293 ("the '293 Application"), titled "90-Degree Lumped and Distributed Doherty Impedance Inverter," filed Aug. 2, 2019. The '293 Application is a Continuation-In-Part of and claims priority to International Application No. PCT/IB2017/000727, titled "90-Degree Lumped and Distributed Doherty Impedance Inverter," filed on Feb. 2, 2017. The '293 Application is also a Continuation-In-Part of and claims priority to International Application No. PCT/IB2017/000717, titled "Methods for Combining Doherty Amplifier Signals with 90-Degree Lumped and Distributed Impedance Inverters," filed on Feb. 2, 2017. The '293 Application is also a Continuation-In-Part of and claims priority to International Application No. PCT/IB2017/000722, titled "90-Degree Lumped and Distributed Doherty Impedance Inverter," filed on Feb. 2, 2017. Each of the foregoing applications is hereby incorporated herein by reference in its entirety.

BACKGROUND

Technical Field

The technology relates to high-speed, high-power, broad-bandwidth, integrated amplifiers which may be constructed from gallium nitride transistors or transistors formed from other semiconductor materials.

Discussion of the Related Art

Gallium nitride semiconductor material has received appreciable attention in recent years because of its desirable electronic and electro-optical properties. GaN has a wide, direct bandgap of about 3.4 eV that corresponds to the blue wavelength region of the visible spectrum. Light-emitting diodes (LEDs) and laser diodes (LDs) based on GaN and its alloys have been developed and are commercially available. These devices can emit visible light ranging from the violet to red regions of the visible spectrum.

Because of its wide bandgap, GaN is more resistant to avalanche breakdown and can maintain electrical performance at higher temperatures than other semiconductors, such as silicon. GaN also has a higher carrier saturation velocity compared to silicon. Additionally, GaN has a Wurtzite crystal structure, is a very stable and hard material, has a high thermal conductivity, and has a much higher melting point than other conventional semiconductors such as silicon, germanium, and gallium arsenide. Accordingly, GaN is useful for high-speed, high-voltage, and high-power applications. For example, gallium-nitride materials are useful in semiconductor amplifiers for radio-frequency (RF) communications, radar, RF energy, and microwave applications.

Applications supporting mobile communications and wireless internet access under current and proposed communication standards, such as WiMax, 4G, and 5G, can place austere performance demands on high-speed or RF amplifiers constructed from semiconductor transistors. The amplifiers may need to meet performance specifications related to output power, signal linearity, signal gain, bandwidth, and efficiency.

SUMMARY

Methods and structures for improving the performance of high-speed, high-power, broad-band, integrated amplifiers are described. The structures and methods relate to circuitry for combining amplified signals and impedance matching at the output of a modified Doherty amplifier. Rearranging the order of signal combining and impedance matching compared to conventional Doherty amplifiers and using an impedance inverter that comprises an integrated distributed inductive element in the form of a microstrip line can appreciably improve amplifier bandwidth and allow scalability of signal amplification to higher powers.

Some embodiments relate to a Doherty amplifier comprising an RF input, a main amplifier connected to the RF input, a peaking amplifier connected to the RF input, a combining node at which an output from the main amplifier combines with an output from the peaking amplifier, and an impedance inverter comprising an integrated distributed inductor connected to an output of the main amplifier and to the combining node.

In some aspects, an input to the impedance inverter comprises one or more bond wires connected to the output of the main amplifier. The combining node may be located at a drain bonding pad of the peaking amplifier. In some implementations, there are no impedance-matching elements connected between the main amplifier and the impedance inverter to match an output impedance of the main amplifier to 50 ohms. The impedance inverter may rotate a phase of a first signal amplified by the main amplifier by no more than 95 degrees with respect to a phase of a second signal amplified by the peaking amplifier.

According to some implementations, the distributed inductor comprises at least one conductive strip line having a width and a length integrated on a substrate. The impedance inverter may further comprise lumped inductive and capacitive elements. In some implementations, the strip line may be mainly inductive. In some cases, the strip line may be divided in two and connected by a capacitor arranged in series. In some aspects, the impedance inverter may further comprise bond wires or conductive interconnects connected between the conductive strip line and outputs of the main amplifier and the peaking amplifier. The width of the strip line may be between approximately 100 microns and approximately 1000 microns. In some aspects, the length of the strip line may be between approximately 2 millimeters and approximately 6 millimeters. In some cases, the main amplifier and peaking amplifier may be integrated on a same substrate as the conductive strip line.

In some implementations, the substrate on which the conductive strip line is formed comprises a high-frequency laminate. In some cases, the substrate may comprise a semiconductor.

According to some aspects, one or both of the main amplifier and peaking amplifier comprises gallium-nitride transistors.

In some implementations, the impedance inverter consists essentially of a conductive strip line having a width and a length integrated on a substrate and bond wires connected between the conductive strip line and outputs from the main amplifier and the peaking amplifier.

In some aspects, a Doherty amplifier may further comprise an impedance-matching element connected between the combining node and an output port of the Doherty amplifier. The impedance-matching element may provide an output impedance of 50 ohms. In some implementations, the impedance-matching element may provide an output impedance between approximately 25 ohms and approximately 100 ohms for the Doherty amplifier.

In some implementations, a RF fractional bandwidth for the amplifier may be between approximately 6% and approximately 18%. An operating frequency for the Doherty amplifier may be between approximately 500 MHz and approximately 6 GHz. In some cases, a Doherty amplifier may be rated for an output power level from the combining node that is between approximately 20 Watts and approximately 100 Watts. In some aspects, a Doherty amplifier may be connected to a cellular transmitter (e.g., incorporated in apparatus of a cellular phone or cellular base station).

Some embodiments relate to methods for amplifying signals. Embodied methods may include acts of splitting a received signal into a first signal and a second signal having a first phase with respect to the first signal; amplifying the first signal with a main amplifier; amplifying the second signal with a peaking amplifier; providing an output from the main amplifier directly to an input of an impedance inverter, wherein the impedance inverter comprises an integrated distributed inductor; and introducing a second phase that compensates for the first phase with the impedance inverter.

In some aspects, the second phase is not more than 95 degrees.

According to some implementations, a method may further include acts of combining an output from the impedance inverter with an output from the peaking amplifier to produce a combined output; and providing the combined output to an impedance-matching element. According to some implementations, a method may further include matching an impedance with the impedance-matching element to a value between approximately 25 ohms and approximately 100 ohms. The combining may be done at a drain bonding pad of the peaking amplifier. In some implementations, the integrated distributed inductor comprises a conductive strip line having a width and a length integrated on a substrate. The width may be between approximately 100 microns and approximately 1000 microns. The length may be between approximately 2 millimeters and approximately 6 millimeters. In some cases, the impedance inverter further comprises bond wires or conductive interconnects connected between the conductive strip line and outputs of the main amplifier and the peaking amplifier.

In some implementations, the main amplifier and peaking amplifier may be integrated on a same substrate as the conductive strip line. The substrate may comprise a high-frequency laminate. In some aspects, the received signal is at a frequency between approximately 500 MHz and approximately 6 GHz. According to some aspects, an RF fractional bandwidth for amplifying the signals may be between approximately 6% and approximately 18%. A power level of the combined output may be between approximately 20 Watts and approximately 100 Watts.

In some aspects, a method may further include providing the combined output for transmission by a cellular base station. A method may also comprise providing no impedance-matching elements between the main amplifier and the impedance inverter that would match an output impedance of the main amplifier to 50 ohms. Any of the amplifying methods may be performed with gallium-nitride transistors.

Some embodiments relate to a Doherty amplifier comprising an RF input, a main amplifier connected to the RF input, a peaking amplifier connected to the RF input, a combining node at which an output from the main amplifier combines with an output from the peaking amplifier, and an impedance inverter comprising a first integrated distributed inductor and a second integrated distributed inductor connected by a capacitor. The impedance inverter may be connected between an output of the main amplifier and to the combining node.

In some aspects, an input to the impedance inverter comprises one or more bond wires connected to the output of the main amplifier. The combining node may be located at a drain bonding pad of the peaking amplifier. In some implementations, there are no impedance-matching elements connected between the main amplifier and the impedance inverter to match an output impedance of the main amplifier to 50 ohms. The impedance inverter may rotate a phase of a first signal amplified by the main amplifier by no more than 95 degrees with respect to a phase of a second signal amplified by the peaking amplifier.

According to some implementations, the first distributed inductor comprises at least one conductive strip line having a first width and a first length integrated on a substrate. The second distributed inductor may comprise at least one conductive strip line having a second width and a second length integrated on a substrate. The impedance inverter may further comprise lumped inductive and capacitive elements. In some implementations, the conductive strip lines may be mainly inductive. In some cases, the first and second conductive strip lines may have approximately equal lengths. In some aspects, the impedance inverter may further comprise bond wires or conductive interconnects connected between the first conductive strip line and an output of the main amplifier. In some aspects, the impedance inverter may further comprise bond wires or conductive interconnects connected between the second conductive strip line and an output of the peaking amplifier. The width of the first and second conductive strip lines may be between approximately 100 microns and approximately 1000 microns. In some aspects, the length of the first or second strip line may be between approximately 1 millimeters and approximately 3 millimeters. In some cases, the main amplifier and peaking amplifier may be integrated on a same substrate as the first and second conductive strip lines.

In some implementations, the substrate on which one or both of the conductive strip lines are formed comprises a high-frequency laminate. In some cases, the substrate may comprise a semiconductor.

According to some aspects, one or both of the main amplifier and peaking amplifier comprises gallium-nitride transistors.

In some implementations, the impedance inverter consists essentially of a first conductive strip line and a second conductive strip line connected by a capacitor, bond wires connected between the first conductive strip line and an output from the main amplifier, and bond wires connected between the second conductive strip line and an output from the peaking amplifier.

In some aspects, a Doherty amplifier may further comprise an impedance-matching element connected between the combining node and an output port of the Doherty amplifier. The impedance-matching element may provide an output impedance of 50 ohms. In some implementations, the impedance-matching element may provide an output impedance between approximately 25 ohms and approximately 100 ohms for the Doherty amplifier.

In some implementations, a RF fractional bandwidth for the amplifier may be between approximately 6% and approximately 18%. An operating frequency for the Doherty amplifier may be between approximately 500 MHz and approximately 6 GHz. In some cases, a Doherty amplifier may be rated for an output power level from the combining node that is between approximately 20 Watts and approximately 100 Watts. In some aspects, a Doherty amplifier may be connected to a cellular transmitter (e.g., incorporated in apparatus of a cellular phone or cellular base station).

Some embodiments relate to methods for amplifying signals. Embodied methods may include acts of splitting a received signal into a first signal and a second signal having a first phase with respect to the first signal; amplifying the first signal with a main amplifier; amplifying the second signal with a peaking amplifier; providing an output from the main amplifier directly to an input of an impedance inverter, wherein the impedance inverter comprises a first integrated distributed inductor and a second integrated distributed inductor connected by a capacitor; and introducing a second phase that compensates for the first phase with the impedance inverter.

In some aspects, the second phase is not more than 95 degrees.

According to some implementations, a method may further include acts of combining an output from the impedance inverter with an output from the peaking amplifier to produce a combined output; and providing the combined output to an impedance-matching element. According to some implementations, a method may further include matching an impedance with the impedance-matching element to a value between approximately 25 ohms and approximately 100 ohms. The combining may be done at a drain bonding pad of the peaking amplifier. In some implementations, the integrated distributed inductor comprises a first conductive strip line having a width and a length integrated on a substrate. The width may be between approximately 100 microns and approximately 1000 microns. The length may be between approximately 1 millimeters and approximately 3 millimeters. In some cases, the impedance inverter further comprises bond wires or conductive interconnects connected between the first conductive strip line and an output of the main amplifier.

In some implementations, the main amplifier and peaking amplifier may be integrated on a same substrate as the first conductive strip line. The substrate may comprise a high-frequency laminate. In some aspects, the received signal is at a frequency between approximately 500 MHz and approximately 6 GHz. According to some aspects, an RF fractional bandwidth for amplifying the signals may be between approximately 6% and approximately 18%. A power level of the combined output may be between approximately 20 Watts and approximately 100 Watts.

In some aspects, a method may further include providing the combined output for transmission by a cellular base station. A method may also comprise providing no impedance-matching elements between the main amplifier and the impedance inverter that would match an output impedance of the main amplifier to 50 ohms. Any of the amplifying methods may be performed with gallium-nitride transistors.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

As described above, amplifiers comprising gallium nitride (GaN) transistors are useful for high-speed, high-voltage, and high-power applications because of the favorable material properties of gallium nitride. In some cases, transistors formed from other semiconductor materials such as gallium arsenide, silicon carbide, silicon germanium, etc., may be suitable for certain high-speed, high-voltage, and high-power applications. Technology areas in which GaN transistors are finding increasing use are radio-frequency (RF) communications and radar. In RF communications, for example, GaN transistors may be used in Doherty amplifiers at a base station to amplify data signals for wireless broadcasting within a cell covered by the base station.

Figure 1:
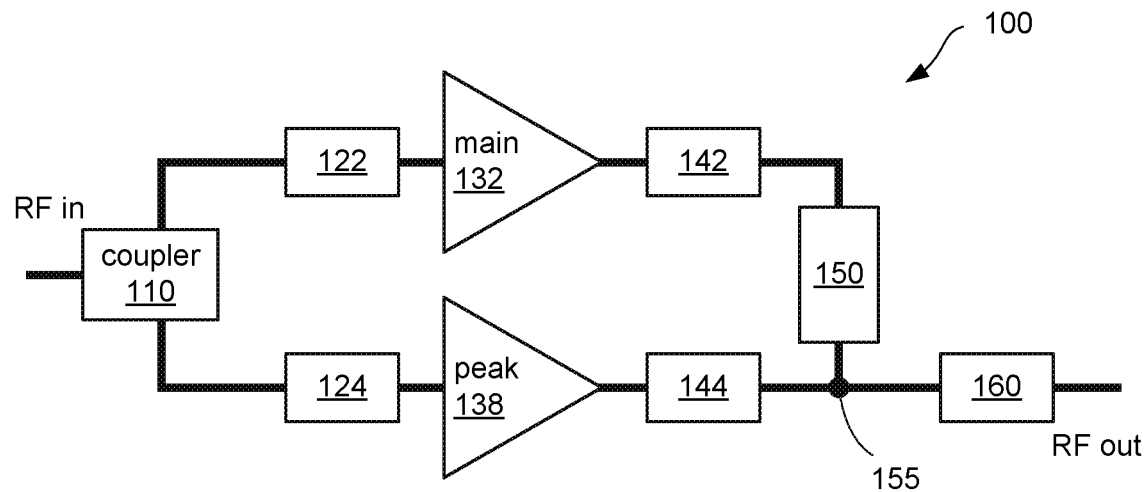
FIG. 1 depicts a first arrangement of a Doherty amplifier.

One arrangement of a Doherty amplifier 100 is shown in FIG. 1. A Doherty amplifier may comprise a main amplifier 132 and a peaking amplifier 138 arranged on parallel circuit branches. An input RF signal is split by a 90-degree coupler 110 that provides an in-phase attenuated signal to the main amplifier and an attenuated signal rotated by 90 degrees (typically delayed by 90°) to the peaking amplifier. After amplification, an impedance inverter 150 that includes a compensating 90-degree rotation is used to recombine the two signals into a combined and amplified output RF signal. An output impedance-matching element 160 may be connected to the combining node to match the output impedance of the Doherty amplifier to the impedance of a load (not shown).

Impedance-matching components 122, 124 may be placed before the main amplifier and peaking amplifier in a Doherty amplifier. These matching components may be used to match the impedances of the transmission lines from the 90-degree coupler 110 to the input impedances of the two amplifiers, so that signal reflections from the amplifiers are reduced or essentially eliminated. Additional impedance-matching components 142, 144 may be placed at the outputs of the main and peaking amplifiers to match impedances to the input of the impedance inverter 150 (which may be 50 ohms by design) and to the combining node 155. The impedance-matching components 142, 144 may comprise resistive, capacitive, and/or inductive circuit elements.

The inventor has recognized and appreciated that there is a cost in bandwidth performance of a Doherty amplifier 100 when impedance-matching components 142, 144 are placed between the outputs of the main and peaking amplifiers 132, 138 and the impedance inverter 150 and combining node 155. At these locations, the impedance-matching components 142, 144 add electrical path length between the two amplifiers so that it may not be possible for the impedance inverter 150 to employ only a 90-degree rotation to compensate for the phase rotation introduced by the 90° coupler. Instead, the impedance inverter 150 may need to operate with a phase rotation θ that is an odd integer multiple of 90 degrees according to the following relation $$\theta \sim (2n+1)90° \qquad \text{EQ. 1}$$

where n is an integer value of 1 or greater.

Figure 2:
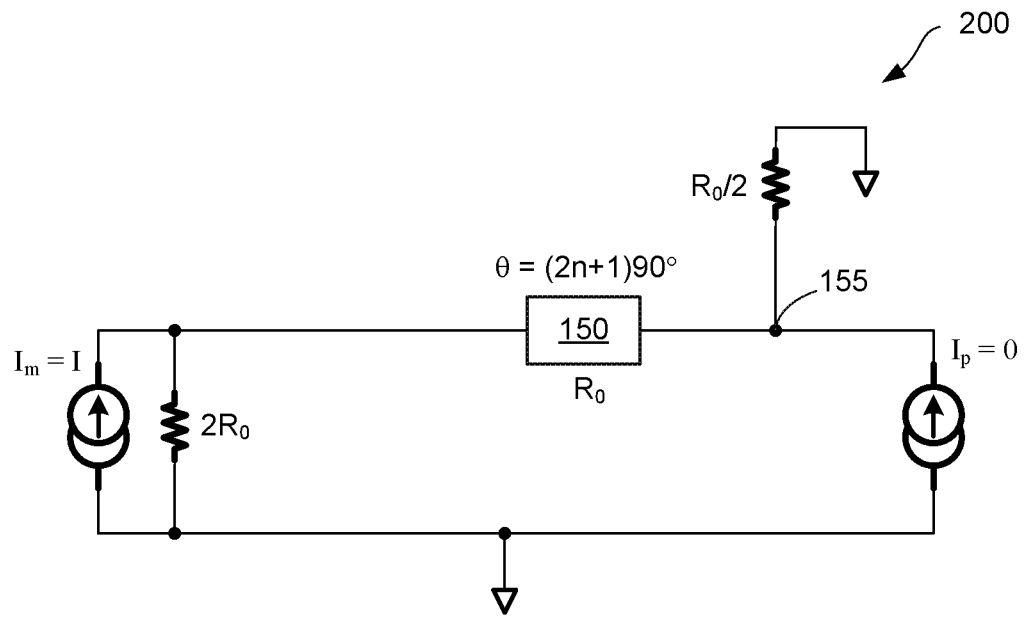
FIG. 2 depicts an equivalent circuit for a Doherty amplifier.

To investigate the cost in bandwidth performance of a Doherty amplifier 100 due to the impedance-matching elements 142, 144, high-frequency simulations were performed using a low-power circuit model 200, which is depicted in FIG. 2. The low-power circuit model represents a case when the peaking amplifier is off. The inventor has recognized and appreciated that when the peaking amplifier is off, a substantial impedance mismatch can occur between the output of the main amplifier 132 and the combining node 155 in the Doherty amplifier. Accordingly, the low-power operation may constrain the rated RF fractional bandwidth for a Doherty amplifier, e.g., a guaranteed bandwidth for all signal levels. In the low-power circuit model 200, the main amplifier 132 is represented as a first current source $I_m$ and the peaking amplifier 138 is represented as a second current source $I_p$, which outputs no current. The impedance inverter 150 is modeled as a transmission line having a resistance $R_o$ and having an adjustable phase rotation, which can be set to an odd multiple of 90° at the center frequency of operation (2 GHz for this simulation). The load impedance is $R_o/2$. For purposes of the simulation, the impedance of the peaking amplifier when off is given a value of $20R_o$.

Simulations circuits and circuit elements described herein may be implemented using a software tool such as Advanced Design System (ADS) available from Keysight Technologies, Inc. of Santa Rosa, Calif. Other suitable software tools include, but are not limited to NI AWR Design Environment available from AWR Corporation of El Segundo, Calif. and Sonnet® software tools available from Sonnet Software of North Syracuse, N.Y.

Figure 3:
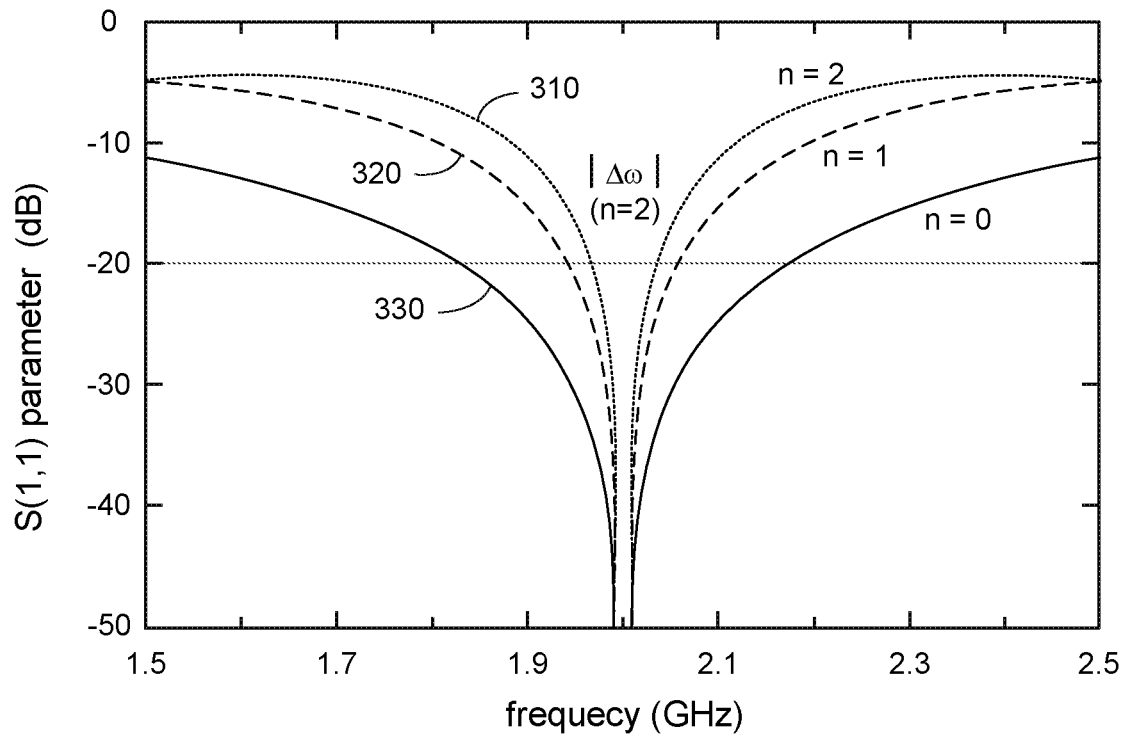
FIG. 3 shows different frequency-response curves and RF fractional bandwidths for different Doherty amplifier designs, according to some embodiments.

Results from the simulations of the Doherty amplifier are shown in FIG. 3. The frequency-response curves 310, 320, 330 plotted in the graph represent the scattering parameter S(1,1) evaluated looking from the output of the main amplifier 132 (e.g. the current source $I_m$) into the impedance inverter 150. The frequency-response curves represent an amount of signal reflected back to the main amplifier (e.g., voltage-to-standing-wave ratio) as a function of frequency. For purposes of evaluating amplifier performance, an RF fractional bandwidth ($\Delta\omega/\omega_o$) for the amplifier may be determined from a frequency difference $\Delta\omega$ between the −20 dB points on the frequency-response curves where the value of the back-reflected signal is at least 20 dB below the signal level input to the impedance inverter.

When the impedance-matching elements 142, 144 are located before the impedance inverter and combining node, the minimum allowable phase rotation by the impedance inverter 150 may be 270° due to the extra electrical path length added by the impedance-matching elements. One such case (n=1 in EQ. 1, dashed line) corresponds to the frequency-response curve 320 plotted in FIG. 3. In this case, the RF fractional bandwidth is approximately 6%. If the added electrical path introduced by the impedance-matching elements 142, 144 is greater, the minimum allowable phase introduced by the impedance inverter 150 may increase to 450° (n=2), which results in the frequency-response curve 310. For this case, the RF fractional bandwidth reduces to about 3%. Conventional Doherty amplifiers for RF communication systems typically operate with RF fractional bandwidths less than about 4%. On the other hand, if the minimum allowable phase introduced by the impedance inverter 150 were 90°, then the RF fractional bandwidth could increase to over 17% as indicated by the frequency-response curve 330.

The inventor has recognized and appreciated that removing the impedance-matching elements 142, 144 before the impedance inverter 150 and combining node 155 allows a reduction in the compensating phase introduced by the impedance inverter to 90° or approximately 90°. Although the compensating phase angle is preferably 90°, in some cases the coupler 110 may impart a phase difference between 85° and 95°, which is compensated by the impedance inverter.

Figure 4:
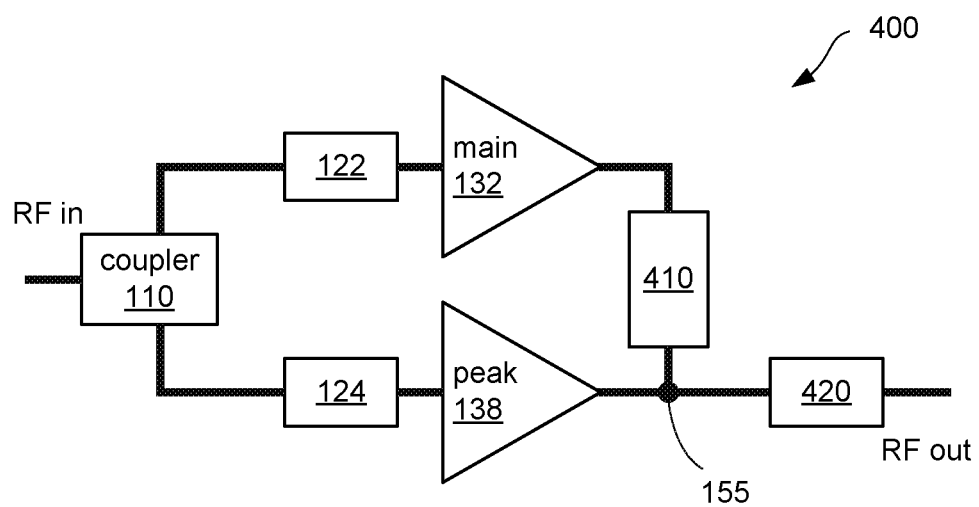
FIG. 4 depicts a modified Doherty amplifier in which signals from the main and peaking amplifiers are combined before impedance is matched to the load, according to some embodiments.

FIG. 4 depicts an embodiment of a modified Doherty amplifier 400 in which signals from the main and peaking amplifiers are combined first, and then impedance is matched to a load after combining. For example, impedance matching can be accomplished in an output impedance-matching element 420 located after the combining node 155. According to some embodiments, the combining node 155 may be located at the output of the peaking amplifier 138. An input to an impedance inverter 410 may connect directly to an output from the main amplifier 132. There may be no impedance-matching element between the output from the main amplifier and an input to the impedance inverter 410 that matches or rotates the impedance from the main amplifier to 50 ohms, for example. Further, there may be no impedance-matching element between the output of the peaking amplifier 138 and the combining node 155.

Figure 5A:
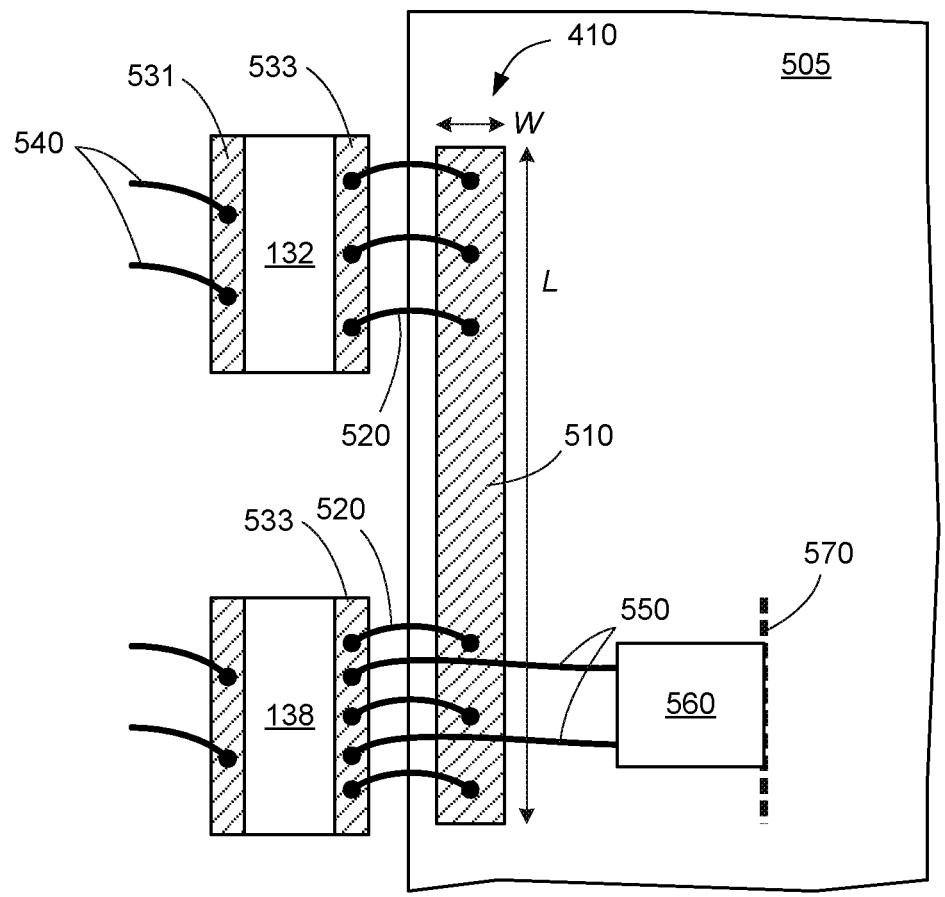
FIG. 5A depicts elements of an impedance inverter that includes lumped and integrated distributed inductance, according to some embodiments.

Further details of an impedance inverter 410 and modified Doherty amplifier 400 are depicted in FIG. 5A, according to some embodiments. In some cases, the impedance inverter 410 comprises a conductive strip line 510 (e.g., a microstrip line) that extends a length L. The length L may extend between and along output drain bonding pads 533 of the main amplifier 132 and the peaking amplifier 138. The conductive strip line 510 may have a width W. The length of the conductive strip line may be between approximately 2 millimeters and approximately 6 millimeters, according to some embodiments, and may be selected to provide a desired inductance for the strip line 510. The width of the conductive strip line may be between approximately 100 microns and approximately 1000 microns, according to some embodiments, and may be selected to provide a desired inductance for the strip line. In some implementations, the conductive strip line is formed over a ground conductor or ground plane and separated from the ground conductor or ground plane by a dielectric material (not shown). In other embodiments, the conductive strip line may not be formed over or adjacent to a ground plane. Instead, a ground plane may be removed from an area of a PCB at which the conductive strip line is patterned. The conductive strip line, when implemented in the impedance inverter for RF signals, may comprise an integrated distributed impedance element which is essentially entirely inductive. In some implementations, the strip line may include some parasitic capacitance and resistance.

The conductive strip line may be formed on a substrate 505, upon which an output impedance matching element 560 may be manufactured. In some embodiments, the main amplifier 132 and the peaking amplifier 138 may be mounted adjacent to the substrate 505 and be on one or more separate dies. In some implementations, the conductive strip line 510 may be integrated onto a same substrate on which the main amplifier 132 and/or the peaking amplifier 138 are formed. The substrate 505 on which the conductive strip line is formed may comprise a printed circuit board in some embodiments, a high-frequency laminate capable of carrying signals at GHz frequencies in some embodiments, a ceramic, or a semiconductor. An example of a high-frequency laminate is laminate model RO4003® available from Rogers Corporation of Chandler, Ariz.

According to some embodiments, an impedance inverter 410 may further include one or more amplifier output bond wires 520 that connect to a drain bond pad 533 of the main amplifier and the conductive strip line 510 near a first end of the strip line (e.g., located within about a first ⅓ of the length of the strip line). Additionally, there may be one or more amplifier output bond wires 520 connected between a drain bond pad of the peaking amplifier 138 and an opposing end of the conductive strip line 510. The output bond wires 520 may be arranged at essentially uniform spacing along the strip line in some embodiments, but may be arranged non-uniformly in other embodiments. The spacing between the bond wires may be between approximately 100 microns and approximately 800 microns. The bond wires 520 may be comprise gold or any other suitable conductor, may have a diameter between 20 microns and 80 microns, and may arc or extend over the substrate 505 and substrate 503 to a height between approximately 50 microns and approximately 250 microns. The output bond wires 520 comprise lumped inductive elements of the impedance inverter 410. Such bond wires are recognized in the field of RF electronics as "lumped inductors" having an inductance that is determined primarily by a length and diameter of the bond wire. There may be amplifier input bond wires 540 connecting to gate bond pads 531 of the main amplifier 132 and the peaking amplifier 138.

In some embodiments where the conductive strip line 510, main amplifier and/or peaking amplifier are integrated onto a same substrate, bond wires 520 may not be used. Instead, conductive interconnects such a microstrip transmission lines or conductive traces may be used to connect the strip line 510 to outputs from the main and peaking amplifiers. In some implementations where the conductive strip line 510, main amplifier and/or peaking amplifier are integrated onto a same substrate, one or both drain bond pads 530 may be replaced with or subsumed into the conductive strip line 510, so that the inductance of the impedance inverter is essentially entirely a distributed inductance.

For the embodiment depicted in FIG. 5A, a combining node of the Doherty amplifier 400 may be located at the drain bond pad 533 of the peaking amplifier 138. In such embodiments, the impedance inverter 410 may comprise lumped inductive elements (for example, the main and peaking amplifier output bond wires 520) and an integrated distributed inductive element comprising the conductive strip line 510. For purposes of analyzing RF performance, the impedance inverter may include lumped capacitive elements, which may include the drain-to source capacitances of the main amplifier 132 and the peaking amplifier 138 and capacitance of the drain bond pads 533. The impedance inverter 410 may further include a small distributed capacitance of the conductive strip line 510.

In some implementations, lumped capacitance elements may be added as shunts to the drain bond pads 533 and/or inductive strip line 510 to adjust an operating frequency of the Doherty amplifier to a desired value, or added in series to extend a length of the impedance inverter for higher power applications. In some cases, an integrated, inductive strip line may comprise two separated strip lines 512 that are connected by a capacitor 580 (e.g., a surface mount capacitor) added in series between the two halves of the strip line, as depicted in FIG. 5C. This arrangement of two strip lines can extend the overall distance between the two amplifiers, allowing larger amplifiers 132, 138 and higher power capability, without adding more inductance. However, the added capacitance should be limited to avoid altering phase rotation in the impedance inverter beyond 95 degrees.

In some cases, there may be output bond wires 550 connected between a drain bond pad 533 of the peaking amplifier 138 and an output impedance-matching element 560 of the Doherty amplifier. The output impedance-matching element 560 may comprise lumped and/or distributed impedance elements that are used to match an impedance from the drain bond pad 533 of the peaking amplifier 138 to a load impedance (e.g., 50 ohms) at a load plane 570.

Figure 5B:
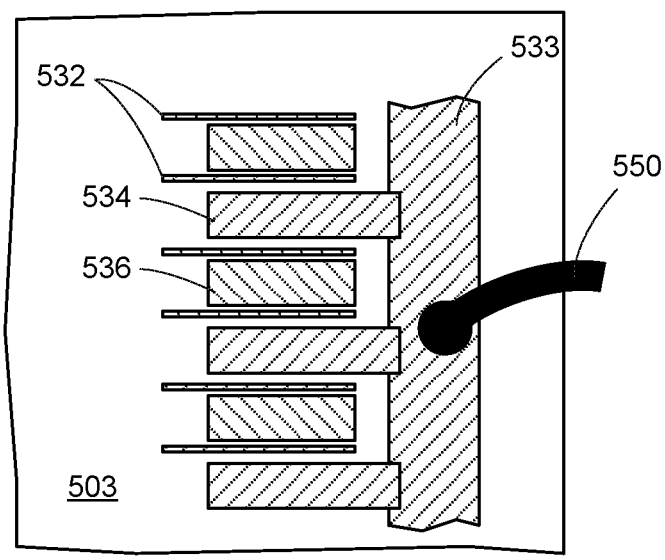
FIG. 5B depicts elements of a power amplifier, according to some embodiments.
Figure 5C:
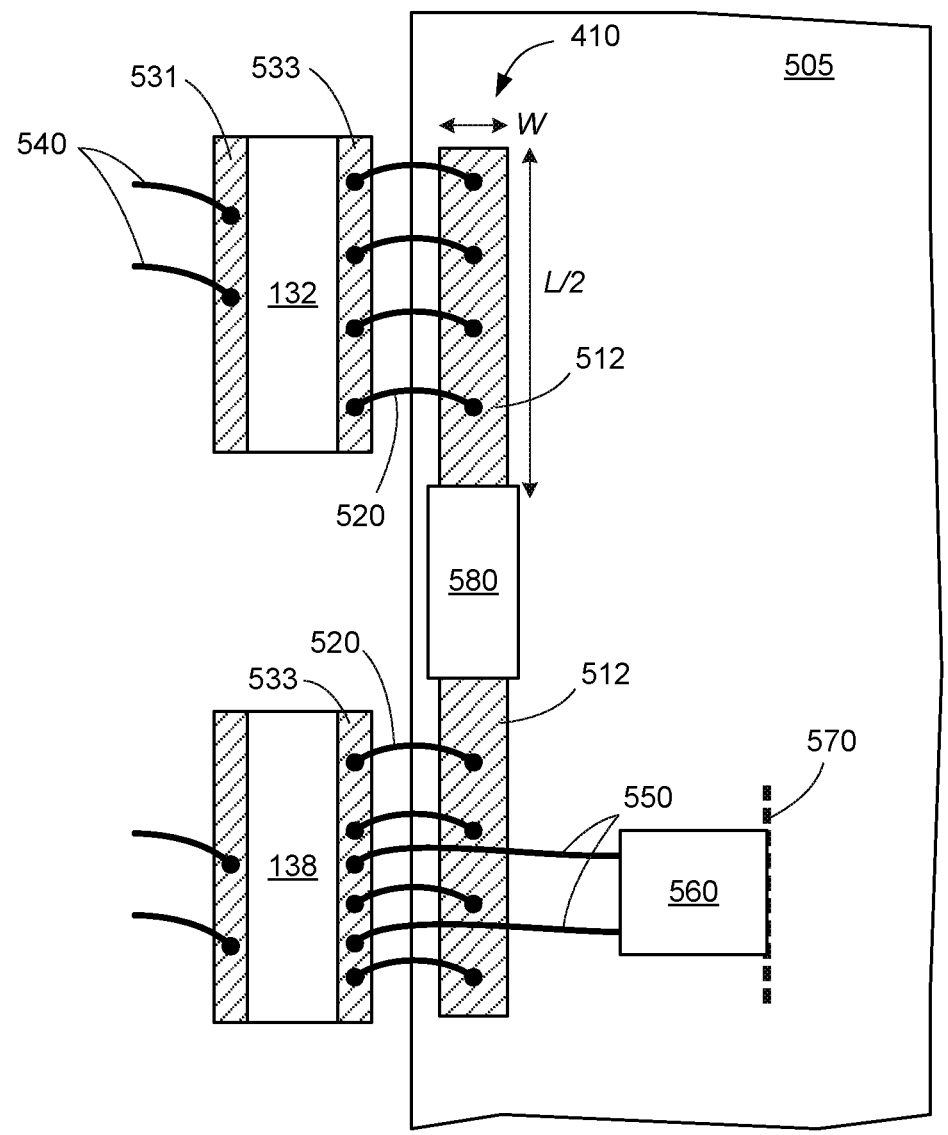
FIG. 5C depicts elements of an impedance inverter that includes lumped and integrated distributed inductance and lumped capacitance, according to some embodiments.

Additional details of structure near the drain bond pads 533 of the main or peaking amplifier are shown in FIG. 5B, for some embodiments. The main amplifier 132 and/or the peaking amplifier 138 may comprise a linear array of transistors having gate conductors 532, drain contacts 534, and source contacts 536 formed on a semiconductor substrate 503. The drain contacts 534 for an amplifier may connect to a drain bond pad 533, at which one or more output bond wires 520, 550 may be bonded. In some implementations, the active regions of the transistors may comprise gallium nitride, which is desirable for high-power, high-frequency amplification of RF signals as described above. As used herein, the phrase "gallium nitride" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_xP_yN_{(1-x-y)}$), aluminum indium gallium arsenide phosporide nitride ($Al_xIn_yGa_{(1-x-y)}As_aP_bN_{(1-a-b)}$), amongst others. In some cases, the transistors may be formed from other semiconductor materials such as gallium arsenide, silicon carbide, silicon germanium, silicon, indium phosphide, etc. and the invention is not limited to gallium-nitride-based amplifiers.

A benefit of a conductive strip line 510 in the impedance inverter as an inductive impedance element is that it can more readily allow for scalability of power of the Doherty amplifier 400 compared to lumped inductive elements only. For example, the power-handling capability of a Doherty amplifier may be determined by the size of transistors in the main amplifier 132 and peaking amplifier 138. Power may be increased in a Doherty amplifier by increasing the number of transistors (gate conductors, drain contacts, and source contacts) along the linear array of transistors in the main amplifier and the peaking amplifier. However, increasing the number of transistors and length of the arrays can require additional amplifier output bond wires 520 between the two amplifiers and corresponding locations on the conductive strip line 510, and may require increasing the length of the strip line.

The addition of amplifier output bond wires 520 and increased length of the strip line would normally increase the inductance of the impedance inverter 410. The inventor has recognized and appreciated that this increase in inductance may be offset by decreasing the inductance of the conductive strip line 510. Inductance of the strip line 510 may be decreased by increasing its width W. By selecting the length and width of the strip line, the distributed inductance of the strip line 510 may be tuned to a desired value. According to some embodiments, a total of the distributed inductance of the strip line may be between approximately 250 picoHenries and approximately 1.5 nanoHenries.

For power scaling in some cases, the inductance of the strip line 510 may be decreased by increasing its width W and/or decreasing its length L. Conversely, the inductance of the strip line may be increased by decreasing its width W and/or increasing its length L. Such changes will also affect any capacitance and resistance of the strip line. The conductive strip line 510 comprises a tunable impedance element for the impedance inverter 410 that may be adjusted at the patterning stage of manufacture for a desired application. Accordingly, power of the Doherty amplifier 400 may be scaled while preserving an operating frequency and bandwidth performance of the Doherty amplifier 400. Such scalability would not be possible in a purely lumped-element impedance inverter where the drain bond pad 533 of the main amplifier 132 is wire bonded directly to the drain bond pad of the peaking amplifier 138.

Adding length to the transistor arrays may also add electrical path length to the impedance inverter 410. As a result, there will be a limit to the total allowed electrical path length, and consequently power, that the Doherty amplifier 400 can handle when arranged as depicted in FIG. 5A. Essentially, the electrical path length can be increased until the phase rotation reaches approximately 90 degrees, though higher values (e.g., up to 95 degrees) may be possible in some cases where the coupler 110 provides a higher phase rotation than 90 degrees. Because the phase rotation for a physical path length will depend on frequency, lower-frequency devices may allow greater length extensions of the amplifier transistor arrays and therefore handle high powers. Initial calculations indicate that Doherty amplifiers configured as shown in FIG. 5A should be capable of amplifying RF signals in frequency ranges between about 500 MHz and about 6 GHz to power levels between about 5 Watts and about 100 Watts at 500 MHz and between about 5 Watts and about 35 Watts at 6 GHz. In some implementations, the rated output power levels can be as high as between about 20 Watts and about 100 Watts at 500 MHz and between about 20 Watts and about 35 Watts at 6 GHz.

In an alternative embodiment, the power capability of the Doherty amplifier 400 may be doubled. Referring again to FIG. 5A, a second main amplifier 132 may be located on a side of the conductive strip line opposite the illustrated first main amplifier 132. The output impedance-matching element 560 may be rotated 90 degrees and mounted near the end of the conductive strip line 510 by the peaking amplifier 138. A second peaking amplifier 138 may be located on a side of the conductive strip line opposite the illustrated first peaking amplifier 138. Drain bond pads from the additional main and peaking amplifiers may be wire bonded to the conductive strip line. Additional bond wires may be connected at angles from the output impedance-matching element 560 to drain bond pads of the peaking amplifiers 138.

Figure 6:
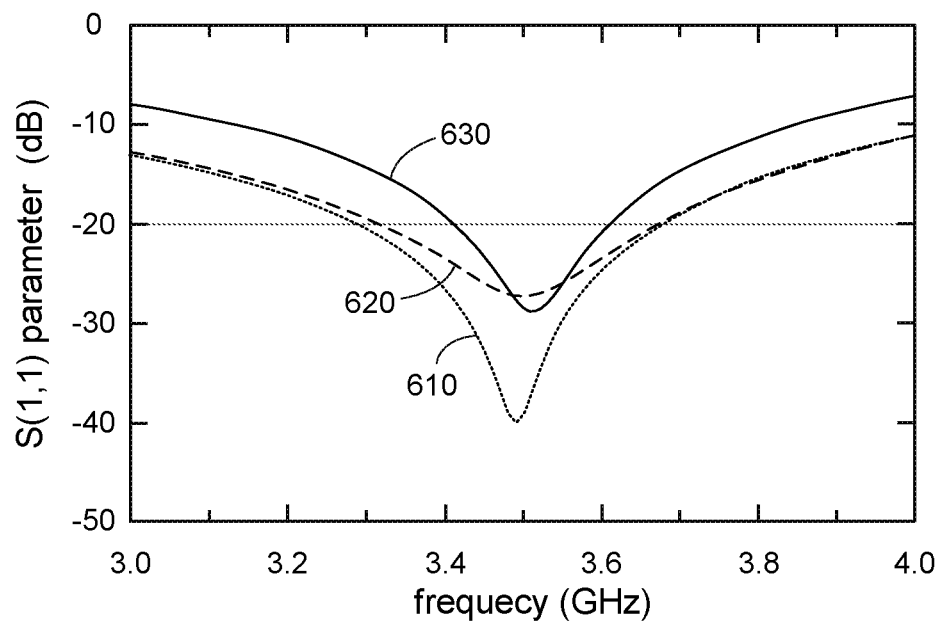
FIG. 6 indicates bandwidth characteristics for different Doherty amplifier designs.

Several circuit simulations were carried out for a Doherty amplifier 400 as arranged in FIG. 4, of which some results are shown in FIG. 6. In a first simulation, the impedance inverter 410 was modeled using a lumped-equivalent model: a single lumped inductor and shunt capacitors arranged in a pi network connected between the main amplifier 132 and the peaking amplifier 138. The capacitors were connected as shunts on either side of the inductor. The value of the inductor was 1.04 nH. The values of the two capacitors were 1.99 pF, which represented a sum of the drain-to-source capacitances (~1.6 pF) and drain bond pad capacitance (~0.39 pF). The circuit arrangement was similar to that shown in FIG. 2, except the impedance inverter 150 is replaced with the lumped pi network and the peaking current source $I_p$ is replaced with a resistance of $20R_o$. The value of $R_o$ was 22.9 ohms. This first simulation was carried out to analyze the feasibility of the Doherty amplifier 400 in which combining is carried out first before impedance matching.

In some embodiments, the values of a Doherty amplifier's operating frequency $\varphi_o$ and inductance Ls of the strip line 510 are constrained in part by amplifier design. For example, an amplifier design may have a drain-to-source capacitance $C_{ds}$, and be rated at a maximum drain-to-source current $I_{max}$ for an operating voltage $V_{ds}$. The resistance $R_o$ at which maximum power may be transferred from the amplifier may be determined approximately from the following relation.

$$R_o \approx 2(V_{ds}-V_k)/I_{max} \qquad (EQ.\ 2)$$

where $V_k$ is the knee voltage for the amplifier. Once $R_o$ is estimated, then it is desirable to have the admittance of the shunt capacitance $C_{sh}$ (primarily determined by $C_{ds}$, though it may include drain pad capacitance and any added capacitance) and the impedance of the impedance inverter's inductance $L_c$ (determined from the wire bonds 520 and strip line 510) match the corresponding admittance and impedance values of $R_o$, which yields:

$$R_o \approx 1/C_{sh}\omega_o \qquad (EQ.\ 3)$$

$$R_o \approx \omega_o L_c \qquad (EQ.\ 4)$$

Since $C_{ds}$ is primarily determined by the amplifiers' design and may be the dominant capacitance, EQ. 3 roughly constrains the operating frequency of the amplifier, though it may be tuned downward by adding additional shunt capacitance. According to some embodiments, when the operating frequency is selected, the conductive strip line may be designed to provide inductance according to EQ. 4.

A frequency-response curve 610 (dotted curve) from the first simulation with a lumped-element impedance inverter is plotted in FIG. 6. The plot represents the scattering parameter S(1,1) looking into the impedance inverter (e.g., looking into the pi network at the first capacitive shunt). The response shows a bandwidth of about 400 MHz centered at an operating frequency of approximately 3.5 GHz. This bandwidth is greater than 11% and represents a significant improvement over a comparable bandwidth performance of a conventional Doherty amplifier at RF frequencies, which is typically less than about 4%.

In a second simulation, the lumped inductor was replaced with a distributed inductor that more accurately modeled the integrated conductive strip line 510 depicted in FIG. 5A. For this simulation, modeling of electromagnetic waves at different frequencies carried by the conductive strip line 510 was carried out using an electromagnetic (EM) field simulation tool. In the EM simulation, the conductive strip line was modeled as having six input ports corresponding to the bond wires 520. The input ports were 50 µm wide, with three spaced at each end on a 500 µm pitch. The length of the conductive strip line was 3.7 mm and the width was 300 µm. The conductive strip line was modeled as being formed from copper (17.5 µm thick) on a high-frequency laminate having a dielectric constant of 3.55 and a loss tangent of 0.002. The thickness of the laminate separating the conductive strip line from a ground plane was 305 µm. For the EM simulation, a mesh was used having 50 cells per wavelength at 4 GHz. The results from the EM simulation for the strip line 510 were used in a circuit simulation of the impedance inverter in which the same values of lumped capacitances (1.99 pF) were used and arranged in the pi network. The circuit arrangement was otherwise the same as that used to generate the frequency-response curve 610. Results from this second simulation are plotted as the frequency-response curve 620 (dashed curve), which indicates that using a distributed inductive element in the impedance inverter adds minimal reduction in the RF fractional bandwidth compared to a purely lumped element impedance inverter. Accordingly, the inductive strip line 510 enables power scalability while essentially maintaining operating frequency and RF fractional bandwidth performance.

Additional EM simulations were carried out to more accurately represent the output bonding pads 533 of the main amplifier 132 and peaking amplifier 138 as well as a circuit simulation to represent the bond wires 520 connected to the bonding pads 533. For the EM simulations, the bonding pads 533 measured approximately 1.8 mm by approximately 85 microns. The bond wires were represented as having a 25 micron diameter, a conductivity of 5×10$^7$ Siemens, extending over a gap of about 500 microns and rising to a maximal height of about 150 microns above the amplifier die. Using the results from the EM simulations in the circuit model for the Doherty amplifier 400 did not appreciably alter the frequency response curve 620.

In an actual device, impedance at the output of the impedance inverter 410 may need to be matched to impedance of a load (e.g., 50 ohms). To further evaluate the performance of the Doherty amplifier 400, an output impedance-matching element 560 was added to the circuit and simulations carried out to account for the added element. For these simulations, an output impedance-matching element 560 depicted in FIG. 7 was used, but the depicted element is only one example of an output-impedance matching element and the invention is not limited to only this configuration. Other embodiments may be used for the output-impedance-matching element in other implementations.

According to some embodiments, output bond wires 550 may be bonded to an output strip line 710 of the output impedance-matching element 560. Shunt capacitors 712, 714 may connect between the output strip line 710 and pads 720, which are connected to an underlying ground conductor using a via and shunt conductor 730. An output capacitor 718 may connect between the output strip line 710 and an output bonding pad 750. For the simulation, the output bonding pad 750 may be shunted to ground with a 50 ohm resistive via to emulate a load. The length and width of the output strip line 710, the values of the shunt capacitors 712, 714, and the value of the output capacitor 718 may be selected to match an impedance from the combining node to an impedance at the load plane 570.

Figure 7:
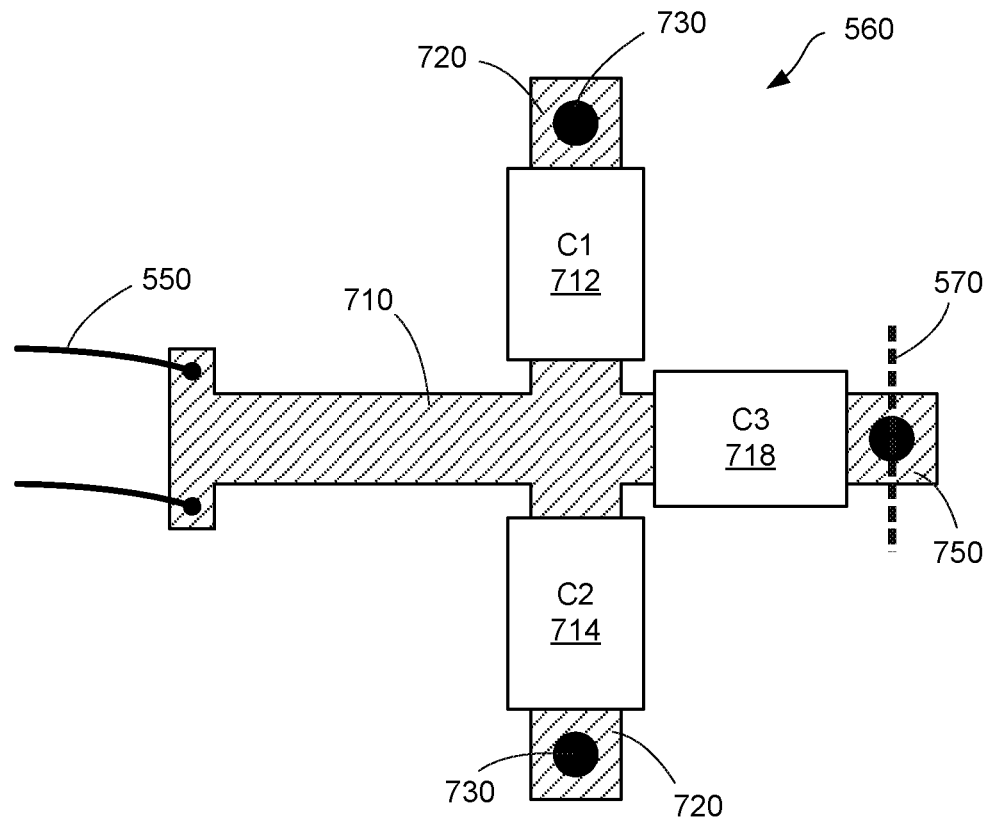
FIG. 7 depicts an impedance-matching element at an output of a modified Doherty amplifier, according to some embodiments.

Results of a simulation of amplifier performance that includes an output impedance-matching element 560 as arranged in FIG. 7 is plotted in FIG. 6 as the frequency-response curve 630. For this simulation, an impedance at the combining node (approximately 11.45 ohms) was matched to a load impedance of approximately 50 ohms. In an EM simulation, the strip line 710 measured approximately 1.4 mm in length with a width of approximately 350 microns, and otherwise used the same electromagnetic properties that were used for the conductive strip line 510. The shunt capacitors 712, 714 were modeled as surface-mount devices (SMDs) having a capacitance of 0.75 pF each. The shunt capacitors and conductive vias 730 had a combined resistance of 0.15 ohm and inductance of 0.3 nH each. The output capacitor 718 was also modeled as an SMD having a capacitance of 6.8 pF, which had a combined resistance of 0.15 ohm and inductance of 0.3 nH.

The result of the simulation that includes the effect of the output impedance-matching element 560, and also includes EM simulations of the output bonding pads 533, is plotted in the frequency-response curve 630 of FIG. 6. For the illustrated impedance-matching element, the RF fractional bandwidth of the amplifier reduces to approximately 200 MHz or about 6% at an operating frequency of about 3.5 GHz. Even with this reduction, the RF fractional bandwidth for the modified Doherty amplifier is nearly twice the bandwidth of a conventional Doherty amplifier. The results of this simulation indicate that if the output impedance-matching is not done well, or has a narrow RF fractional bandwidth, then the overall bandwidth of the device may be limited by the output impedance-matching element 560.

Figure 8:
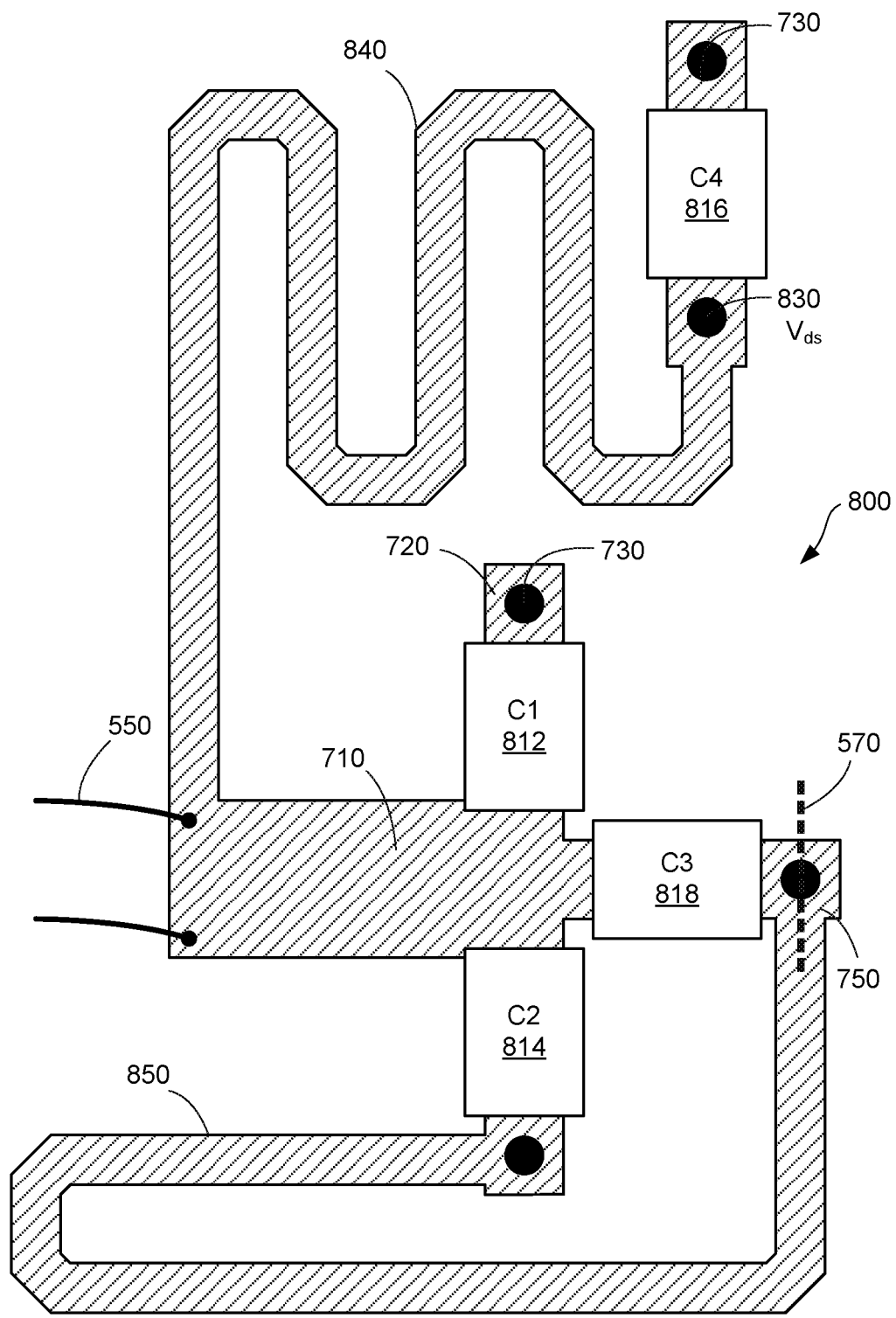
FIG. 8 depicts a double-section impedance-matching element at an output of a modified Doherty amplifier, according to some embodiments.

To recover a broader bandwidth, a double-section output impedance-matching element 800 may be used, as depicted in FIG. 8. A double-section impedance-matching element may comprise an added inductive strip line 850 that connects to the output bonding pad 750 and to capacitive shunt 814. The dimensions of the strip line 710 may be resized to provide a desired inductance for the first section.

Some embodiments may include transistor biasing components comprising an inductive strip line 840 that connects to a DC biasing port 830, at which voltage for biasing drains of transistors in the amplifiers 132, 138 may be applied. A shunt capacitor 816 may be connected to the biasing port 830. When installed in a device, an additional capacitor may be mounted external to the board on which the impedance-matching element 800 is formed and arranged in parallel to the shunt capacitor 816. The external capacitor may have a value between 2 microFarads and 50 microFarads.

Further simulations were carried out for the double-section impedance-matching element in which the values of capacitances were as follows: C1=C2=0.7 pF, C3=1.2 pF, and C4=6.8 pF. The double-section impedance-matching element 800 provides improved impedance matching over a range of RF frequencies near the center or carrier frequency at 3.5 GHz, as compared to the single section depicted in FIG. 7. Therefore, it removes a bandwidth bottleneck associated with the single section impedance-matching element 560 and recovers the RF fractional bandwidth available for the impedance inverter. The simulations show that the resulting RF fractional bandwidth recovers to approximately 18%.

In some implementations, additional impedance-matching sections may be included between the impedance inverter and load. Whether comprising one or more sections, an output impedance-matching element preferably transforms the impedance at the output of the impedance inverter 410 to match or approximately match the impedance at the load plane 570 over a bandwidth of interest (e.g., 80 MHz, 100 MHz, 200 Mhz, 400 MHz, or any desired RF fractional bandwidth in this range) at the carrier frequency (3.5 GHz in the above example, though other carrier frequencies may be used).

Methods for operating a Doherty amplifier using the above-described apparatus are also contemplated. In some implementations, a method for operating a Doherty amplifier 400 may comprise acts of splitting a received signal into a first signal and a second signal having a first phase with respect to the first signal, amplifying the first signal with a main amplifier 132, and amplifying the second signal with a peaking amplifier 138. A method embodiment may further comprise providing an output from the main amplifier directly to an input of an impedance inverter 410, wherein the impedance inverter comprises an integrated distributed inductor, and introducing a second phase with the impedance inverter that compensates for the first phase. In some implementations, a method for operating a Doherty amplifier may further comprise combining an output from the impedance inverter 410 with an output from the peaking amplifier 138 to produce a combined output, and providing the combined output to an impedance-matching element 560 that matches the output impedance to the impedance of a load. The load impedance may have a value of 50 ohms or approximately 50 ohms. In some implementations, the load impedance may have a value between approximately 25 ohms and approximately 100 ohms. Operation of a Doherty amplifier 400 may further comprise providing the combined output for transmission by a cellular base station.

CONCLUSION

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A Doherty amplifier comprising:
an RF input;
a main amplifier connected to the RF input;
a peaking amplifier connected to the RF input;
an impedance inverter comprising an integrated distributed inductor connected between an output of the main amplifier and an output of the peaking amplifier; and
an output impedance-matching element comprising an output strip line, a shunt capacitor connected between the output strip line and ground, an output capacitor connected between the output strip line and an output bonding pad, and an inductive strip line connected between the output bonding pad and ground.

2. The Doherty amplifier of claim 1, wherein:
the shunt capacitor is connected between the output strip line and a via to ground; and
the inductive strip line is connected between the output bonding pad and the via to ground.

3. The Doherty amplifier of claim 1, wherein the impedance inverter comprises one or more bond wires connected to the output of the main amplifier.

4. The Doherty amplifier of claim 3, wherein the impedance inverter further comprises one or more additional bond wires connected to the output the peaking amplifier.

5. The Doherty amplifier of claim 1, wherein there are no impedance-matching elements connected between the main amplifier and the impedance inverter.

6. The Doherty amplifier of claim 1, wherein the impedance inverter rotates a phase of a first signal amplified by the main amplifier by no more than 95 degrees with respect to a phase of a second signal amplified by the peaking amplifier.

7. The Doherty amplifier of claim 1, wherein the integrated distributed inductor comprises a conductive strip line on a substrate.

8. The Doherty amplifier of claim 7, wherein a width of the conductive strip line is between 100 and 1000 microns.

9. The Doherty amplifier of claim 8, wherein a length of the conductive strip line is between 2 and 6 millimeters.

10. The Doherty amplifier of claim 1, wherein the integrated distributed inductor comprises a first integrated distributed inductor, a second integrated distributed inductor, and a capacitor connected in series between the first integrated distributed inductor and the second integrated distributed inductor.

11. The Doherty amplifier of claim 1, further comprising:
a combining node at which the output of the main amplifier combines with the output of the peaking amplifier, wherein
the combining node comprises a drain bonding pad of the peaking amplifier.

12. The Doherty amplifier of claim 1, wherein one or both of the main amplifier and peaking amplifier comprises gallium-nitride transistors.

13. The Doherty amplifier of claim 1, wherein the impedance inverter consists essentially of:
a conductive strip line having a width and a length integrated on a substrate;
bond wires connected between the conductive strip line and outputs from the main amplifier and the peaking amplifier; and
drain-to-source capacitances of the main amplifier and the peaking amplifier.

14. The Doherty amplifier of claim 1, wherein the output impedance-matching element provides an output impedance of approximately 50 ohms for the Doherty amplifier.

15. The Doherty amplifier of claim 1, wherein an RF fractional bandwidth for the Doherty amplifier is between approximately 6% and approximately 18%.

16. The Doherty amplifier of claim 1, wherein an operating frequency for the Doherty amplifier is between approximately 500 MHz and approximately 6 GHz.

17. The Doherty amplifier of claim 1, wherein a rated output power level of the amplifier is between 20 and 100 Watts.

18. A method for amplifying signals comprising:
splitting a received signal into a first signal and a second signal having a first phase with respect to the first signal;
amplifying the first signal with a main amplifier;
amplifying the second signal with a peaking amplifier;
providing an output from the main amplifier to an input of an impedance inverter, wherein the impedance inverter comprises an integrated distributed inductor;
introducing a second phase that compensates for the first phase with the impedance inverter;
combining an output from the impedance inverter with an output from the peaking amplifier; and
providing the combined output to an output impedance-matching element, the output impedance-matching element comprising an output strip line, a shunt capacitor connected between the output strip line and ground, an output capacitor connected between the output strip line and an output bonding pad, and an inductive strip line connected between the output bonding pad and ground.

19. The method of claim 18, wherein:
the shunt capacitor is connected between the output strip line and a via to ground; and
the inductive strip line is connected between the output bonding pad and the via to ground.

* * * * *